__United States Patent__ [19]

Bittner et al.

[11] Patent Number: 5,001,416

[45] Date of Patent: Mar. 19, 1991

[54] APPARATUS AND METHOD FOR DETECTING AND MEASURING CHANGES IN LINEAR RELATIONSHIPS BETWEEN A NUMBER OF HIGH FREQUENCY SIGNALS

[75] Inventors: John W. Bittner, Shoreham; Richard W. Biscardi, Ridge, both of N.Y.

[73] Assignee: Associated Universities, Inc., Washington, D.C.

[21] Appl. No.: 488,118

[22] Filed: Mar. 5, 1990

[51] Int. Cl.$^5$ ............................................. G01N 27/00
[52] U.S. Cl. ................................... 324/71.3; 250/394; 324/686; 328/233; 328/235
[58] Field of Search ...................... 324/71.3, 71.1, 658, 324/608, 681, 686, 679; 250/394, 385.1, 342; 328/233, 235

[56] References Cited

U.S. PATENT DOCUMENTS

| | | | |
|---|---|---|---|
| 3,524,998 | 8/1970 | Gilbert | 324/71.3 X |
| 3,530,241 | 9/1970 | Ellis | 324/71.3 X |
| 3,857,090 | 12/1974 | Chick | 250/394 X |
| 4,524,277 | 6/1985 | Shimura et al. | 250/397 |
| 4,607,194 | 8/1986 | Yin | 324/71.3 X |
| 4,686,531 | 8/1987 | Shambroom et al. | 324/679 X |
| 4,752,728 | 6/1988 | Nakamura et al. | 324/71.3 |

Primary Examiner—Kenneth Wieder
Assistant Examiner—Robert W. Mueller
Attorney, Agent, or Firm—Margaret C. Bogosian; Vale P. Myles

[57] ABSTRACT

An electronic measurement circuit for high speed comparison of the relative amplitudes of a predetermined number of electrical input signals independent of variations in the magnitude of the sum of the signals. The circuit includes a high speed electronic switch that is operably connected to receive on its respective input terminals one of said electrical input signals and to have its common terminal serve as an input for a variable-gain amplifier-detector circuit that is operably connected to feed its output to a common terminal of a second high speed electronic switch. The respective terminals of the second high speed electronic switch are operably connected to a plurality of integrating sample and hold circuits, which in turn have their outputs connected to a summing logic circuit that is operable to develop first, second and third output voltages, the first output voltage being proportional to a predetermined ratio of sums and differences between the compared input signals, the second output voltage being proportional to a second summed ratio of predetermined sums and differences between said input signals, and the third output voltage being proportional to the sum of signals to the summing logic circuit. A servo system that is operably connected to receive said third output signal and compare it with a reference voltage to develop a slowly varying feedback voltage to control the variable-gain amplifier in said common amplifier-detector circuit in order to make said first and second output signals independent of variations in the magnitude of the sum of said input signals.

7 Claims, 2 Drawing Sheets

APPARATUS AND METHOD FOR DETECTING AND MEASURING CHANGES IN LINEAR RELATIONSHIPS BETWEEN A NUMBER OF HIGH FREQUENCY SIGNALS

This invention was made with Government support under contract number DE-AC02-76CH00016, between the U.S. Department of Energy and Associated Universities, Inc. The Government has certain rights in the invention.

BACKGROUND OF THE INVENTION

The invention relates to an apparatus and method for monitoring and measuring the relative amplitude of a predetermined number of electrical input signals and, more particularly, provides an apparatus and method that is useful in measuring, on a real time basis, the position of a beam of charged particles relative to the walls of a particle accelerator ring evacuated chamber or related device within which the beam is confined.

It is well known in the design and operation of particle beam accelerators, such as synchrotrons and storage rings, to provide beam position monitoring and measuring apparatus that is used to develop signals which are dependent upon the position of the beam relative to selected sections of the walls of the accelerator. Present day processes for measuring the position of a charged particle beam relative to the walls of an accelerator vacuum chamber involve placing a number of detector electrodes at selected points along the vacuum chamber walls to pick up signals induced in the electrodes by movement of the charged particle beam past the electrodes. Such measurements require the use of signals from a number of electrodes. Individual amplifier-detector equipment is normally required for each electrode involved in the measurement, and each such amplifier-detector must perform in precisely identical fashion, over a wide variation of signal strengths.

In addition, a means must be provided to normalize the results for variations in the magnitude of electrical charge on the beam of particles. This either involves the use of an electronic analog dividing circuit, which is expensive and difficult to adjust and has a limited dynamic range, or involves devices which must convert analog signals to digital signals, along with related digital processing equipment; both of which alternatives are cumbersome and expensive.

The position of a particle beam relative to its associated vacuum chamber walls is often influenced by mechanical motion of various elements of the accelerator, or by magnetic or electrical disturbances of an extraneous nature. It is necessary that the response time of the apparatus does not limit the ability of various bending-correction magnets to appropriately correct the changes in the beam position caused by these kinds of disturbances.

This invention resolves the problems outlined above. In particular, the invention (1) eliminates the need for a multiplicity of precisely matched amplifier and detector channels, in order to measure a plurality of beam position-dependent signals; and (2) eliminates the need for an analog or digital dividing circuit in such measurement applications. Furthermore, the response of the apparatus of the invention is sufficiently fast that its output can rapidly control charged particle beam bending magnets, thereby to make real-time corrections to the beam position, as required by the electrical disturbances and other accelerator perturbance factors previously mentioned.

In the preferred embodiment of the circuit of the invention, the detector and other circuit components following the amplifier need operate only over a limited linear range, which is independent of beam intensity.

One common method of detecting the position of a charged particle beam within an accelerator vacuum chamber is to mount a set of four pick-up electrodes at predetermined points on the chamber such that two of the pick-up electrodes are located above and two below the beamline. As charged particles in the beamline move past the pick-up electrodes, the capacitive coupling of the charged particles with the electrodes develops signals on the electrodes that are dependent on the position of the beamline relative to the electrodes. From such a set of four electrodes installed in an accelerator vacuum chamber, the transverse position of the charged beamline can be determined, using well known formulas for calculating certain sum and difference ratios between the radio frequency signals induced on the electrodes by their coupling with the beamline.

SUMMARY OF THE INVENTION

In a preferred form of the invention, which is useful to measure the position of a bunched, charged particle beam relative to the walls of an associated accelerator vacuum chamber of a circular or cyclic accelerator, such as a synchrotron or storage ring, signals dependent on the beam position within the chamber are induced on a set of pick-up electrodes. The bunched particles repeatedly pass these pick-up electrodes, so the resultant signals induced on the electrodes form a periodic train of signal pulses which have a Fourier spectrum of sinusoidal voltages having frequencies that are harmonics of the revolution frequency of the bunched particles around the accelerator vacuum chamber. These signals are filtered to remove frequency components above about 300 Mhz, then multiplexed using a gallium arsenide (GaAs) field effect transistor (FET) four-pole high speed switch. A five section helical bandpass filter is used to select a particular harmonic as the Fourier component to be detected. The multiplexed signals are then mixed down to 10.7 Mhz (megahertz) where a single IF amplifier/detector channel is used to detect the amplitude of each signal. The signals are demultiplexed by another high-speed switch. Integrating sample and hold circuits are used to store the signal information. The measurement cycle is repeated at a rate of 40 Khz. To produce voltages indicative of the beamline position, the sums and differences of the stored signals are obtained. These beam-position signals are derived using simple integrated circuits at baseband frequencies. The results are normalized with respect to beam current by means of a feedback servo amplifier circuit, which adjusts the gain of the IF amplifier to keep constant the sum of the four stored signals. Low pass filters limit to 300 Hz three output signals that correspond to vertical position, horizontal position and the sum of the input signals.

An object of the present invention is to provide an apparatus for determining the position of a beam of charged particles relative to the walls of a beamline vacuum chamber by means of a common amplifier-detector system which is switched between a plurality of electrodes thereby eliminating the heretofore typical requirement for use of separate amplifier-detector components each of which must be carefully matched to each other for each electrode.

Another object is the elimination of relatively expensive and difficult to adjust analog dividing circuits for the relatively complicated digital processing, to perform similar calculations, in order to remove the influences of variations in the amount of charge on the charged particle bunches in a particle beam. This is done by means of a servo or feedback circuit which controls the gain of a single amplifier in such a way that the sum of signals from a plurality of pick-up electrodes is maintained equivalent to a predetermined value.

A further object of this invention is to provide a circuit having detector and signal processing elements, arranged subsequent to an adjustable gain amplifier so that these elements are required to only operate over a narrower range of signals than would otherwise typically be necessary, for example in more conventional apparatus employing fixed gain amplifiers. This means that these elements are operated over a more linear part of their range, so their accuracy is greatly improved.

A still further object is to provide a charged particle beam position monitoring and a measuring apparatus that generates signals on a real time basis which are useful to control beam positioning apparatus that is operable to correct the position of the beam relative to the walls of an associated accelerator vacuum chamber within which the beam is maintained.

Other objects and advantages of the invention will become apparent to those skilled in the art from the description of it presented herein.

DESCRIPTION OF THE PREFERRED EMBODIMENT

Figure 1:
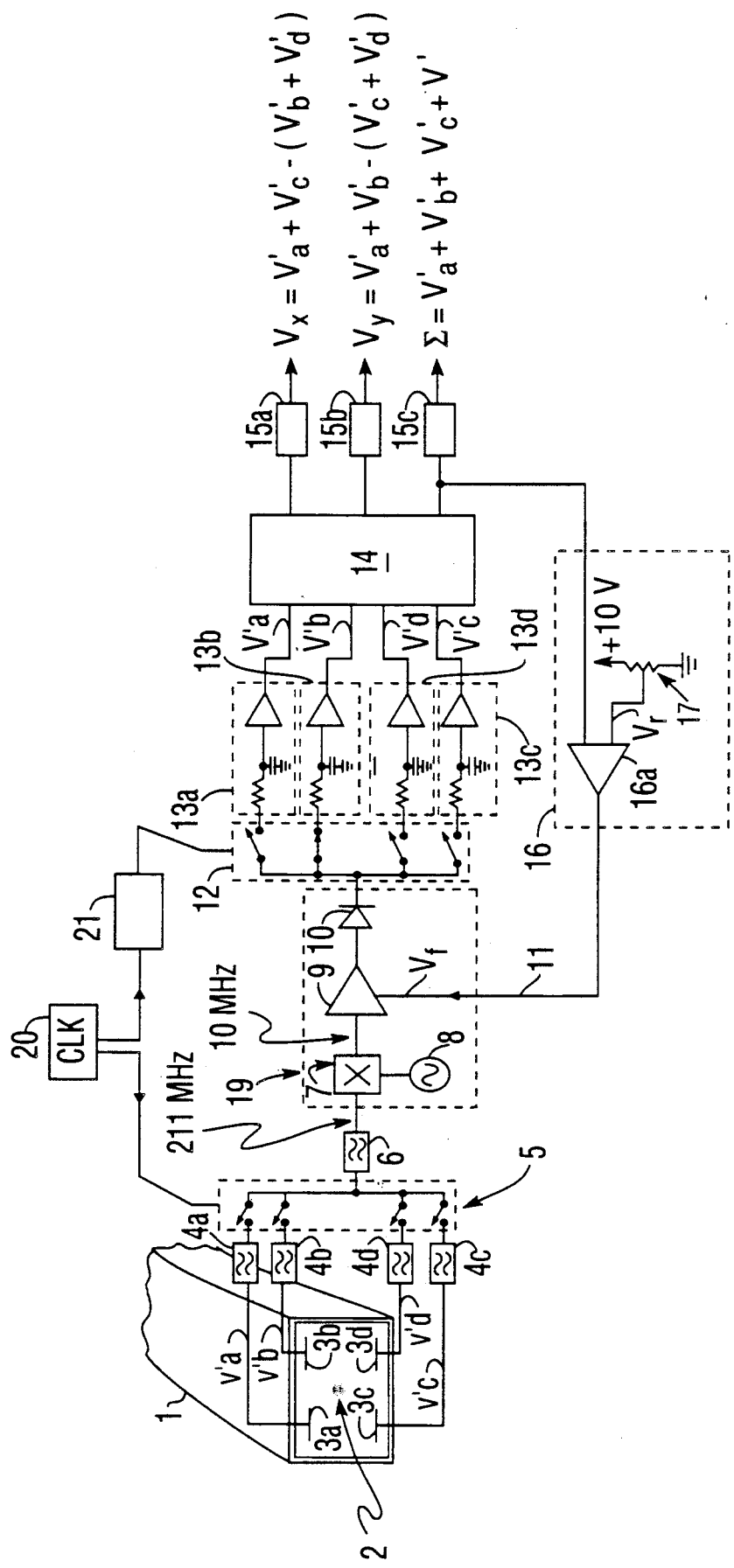
FIG. 1 is a schematic circuit diagram of a position monitoring and measuring apparatus that includes a feedback servo circuit in accordance with the teaching of the present invention.

The apparatus and method of the invention are useful for comparing the relative amplitude of a plurality of signals, such as the signals that are produced by a plurality of conventional capacitively coupled pick-up electrodes mounted at predetermined positions adjacent to a beam of charged particles in the vacuum chamber of a particle accelerator. Accordingly, the preferred embodiment of the invention will be described with reference to its application for measuring the transverse position of a charged beam of particles relative to the walls of such a conventional particle accelerator chamber. Referring to FIG. 1, there is shown in cross-section an end view of such a particle accelerator vacuum chamber 1, which happens to be generally rectangular in shape in this embodiment. It will be understood that the shape of the chamber is not critical to the operation of the invention. In general, such vacuum chambers are formed as elongated generally annular passageways that have circular or eliptical cross-sections through which spaced bunches of electrons or other charged particles are circulated around the circumference of the passageway. One bunch of such charged particles 2 is shown near the center of the illustrated vacuum chamber 1.

During the operation of such a particle accelerator, it is desirable to maintain the beam of charged particles as near to the center of the chamber 1 as possible, over the entire annular or eliptical path of travel of the charged particles. In order to accomplish that objective, it is necessary to detect and accurately measure any transverse movement of the bunches of particles 2 relative to either the horizontal or vertical axes (designated x and y, respectively, herein) of the chamber 1. As is conventional for such detection purposes, four small circular electrode plates 3a, 3b, 3c, and 3d, of conventional pick-up electrodes are mounted in the chamber 1. Any suitable conventional means may be employed to form a vacuum-type seal between the electrode conductors and the housing of chamber 1. Preferably, the electrode plates (3a-3d) are symmetrically arranged in the vacuum chamber 1 at one or more pre-selected points around the circumference of the elongated vacuum chamber 1. Only one set of four such plates is shown in FIG. 1, for the purpose of describing the present invention.

Those familiar with the operation of such particle accelerators will recognize that as sequential bunches of charged particles (2) are driven past the pick-up electrodes during the normal operation of the accelerator, which drives such bunches of particles around the annular evacuated passageway, each of the bunches of charged particles is capacitively coupled to the pick-up electrode plates (3a-3d) and induces electrical impulses or signals $v_a, v_b, v_c$ and $v_d$ onto each of the plates and the electrical conductors connected thereto. As the bunches of electrons (2) are continuously accelerated around the annular or elliptical circumference of the chamber 1 the bunches of electrons repeatedly pass the pick-up plates 3a-3d and, due to their capacitive coupling with those plates, induce a periodic train of voltage pulses or signals on the plates. Those induced signals, can be considered as a Fourier spectrum of sinusoidal voltages having frequencies which are harmonics of the revolution frequency of the bunches of charged particles around the circumference of the accelerator.

A plurality of low-pass signal filters 4a, 4b, 4c and 4d are connected to receive, respectively, the signals $v_a$–$v_d$ which are generated by the pick-up electrodes. These low-pass filters are selected to eliminate undesired higher frequency harmonics of those generated signals. In the preferred embodiment, the lowpass filters $4_a$–$4_d$ are commercially available Mini-Circuits Type PLP 300. According to the present invention, a high speed electronic switch 5, which preferably is a gallium arsenide, four-pole, FET switch of the type that is commercially available from Anzac Co. under the Catalogue or Model No. SW254, has each of its input terminals connected, respectively, to the low-pass filters. The high speed switch 5 is operable to connect the four signals $v_a$–$v_d$, in sequence, to the narrow bandpass filter 6, which is operable to select a single desired harmonic of the signals input to it. The bandpass filter 6, in the preferred embodiment is a Type 5C30-21654/1-0/0, commercially available from K.L. Microwave, Inc. and it is connected, as shown, by suitable conductor means to a single amplifier-detector channel 19 that consists principally of a conventional electronic mixer 7, which in the disclosed circuit is a Mini-Circuits Type SRA-1, a local oscillator 8 which in the disclosed circuit is a Type C0223FW that is commercially available from Vectron Laboratory, Inc., an adjustable gain IF amplifier 9 and a detector 10, which in the preferred embodiment is a type MC1330 integrated circuit available from Motorola Corp. The IF amplifier 9 is of a conventional commercial type available from Motorola Corp., Model No. MC1349, the gain of which can be controlled by means of an external signal $V_f$ on a feedback conductor 11, to which further reference will be made below.

A second high speed electronic switch 12, which may be similar to the gallium arsenide switch 5, however, in the preferred embodiment a FET switch-integrated circuit Type SW01, available from Precision Monolithics, Inc. is useful for the switch 12. It is operably connected to receive the signals output from the detector 10. In addition, the switches 5 and 12 are connected, as shown in FIG. 1, to a timing circuit or clock 20 that is used to synchronize the operation of the two switches in a desired manner such that the dwell time of the contacts on switch 12 is kept shorter than the dwell time of the contacts on switch 5. Four integrating sample and hold circuits 13a, 13b, 13c and 13d are connected, respectively, to one of the four output terminals or contacts on the switch 12, thereby to connect the output signals from the detector 10, through the respective terminals of the switch 12, in turn to the four integrating sample and hold circuits. In this embodiment, the sample and hold circuits 13a–13d contain FET amplifiers, Type LM356, available commercially from National Semiconductor Corp.

The outputs of the integrating sample and hold circuits 13a–13d are each normally varying voltages $V'_a$, $V'_b$, $V'_c$, $V'_d$, which are proportional to the amplitudes of the respective impulses or signals $v_a-v_d$ that are induced on the pick-up electrode plates 3a–3d. These varying signals $V'_a-V'_d$ are then combined by means of a conventional summing logic means 14, which comprises a plurality of conventional operational amplifiers (that are illustrated and described in more detail below with reference to FIG. 2, and are Precision Monothilics, Inc. Type OP-07 in the disclosed embodiment) in order to produce desired output voltages that are functions of the signals capacitively coupled to the pick-up electrodes 3a–3d and that include: an output voltage $V_x$ is produced proportional to the transverse horizontal (x-axis) position of the charged particle beam 2, an output signal $V_y$ is produced proportional to the transverse vertical (y-axis) position of the charged particle bunch 2, and an output signal is produced equal to the sum of the four output voltages from the integrating sample and hold circuits 13a–13d. These output voltages can be defined by the following equations:

$$V_x = V'_a + V'_c - (V'_b + V'_d)$$

$$V_y = V'_a + V'_b - (V'_c + V'_d)$$

$$\Sigma = V'_a + V'_b + V'_c + V'_d$$

A plurality of low pass filters 15a, 15b and 15c are connected, as shown, to optimize the output signals. In the preferred embodiment these low pass filters use operational amplifier, Type OP-07, available from Precision Monolithics, Inc. As thus far described, if one were to assume that the gain of the amplifier 9 were constant, the output signals $V_x$ and $V_y$ would be proportional to the displacement of a particle beam bunch (2) in orthogonal directions x (horizontal) and y (vertical); however, those signals would also be proportional to the electrical charge that is contained in the particle bunch 2. The $\Sigma$(sum) voltage output signal is relatively independent of the transverse position of the particle bunch 2, especially for small transverse displacements of the particle bunch, so if one were to assume a constant gain for amplifier 9, the signal $\Sigma$(sum) would only be dependent upon the amount of electric charge on the particle bunch 2.

In order to remove the dependency of the output signals $V_x$ and $V_y$ on the electric charge of the particle bunch 2, it is usual practice to divide the voltage signals $V_x$ and $V_y$ electronically by the $\Sigma$(sum) voltage. Commercially available analog dividing circuits are sometimes used for that purpose, but they are relatively expensive and difficult to adjust and operate over only a relatively limited range of input voltages. Likewise, digital processing techniques can be used to perform the same operation but such techniques are quite complicated and are relatively expensive to implement. Such problems are avoided by the present invention by providing a feedback or servo system 16 which is operable to compare the $\Sigma$(sum) signal with a fixed reference voltage source such as the ten volt reference voltage source illustrated schematically in FIG. 1. The operational amplifier used in the comparator 16a of the disclosed feedback circuit is a Type OP-07, available from Precision Monolithics, Inc. A potentiometer 17 is used to selectively adjust and set a reference voltage to a desired level of $V_r$, thus the servo system 16 is made to supply a slowly varying control feedback voltage $V_c$ on conductor 11 to the amplifier 9 in a manner that is effective to maintain the (sum) voltage signal at the output of the low pass filter 15c constant and proportional to $V_r$. Accordingly, pursuant to the invention, the gain of the common amplifier 9, by use of the servo system 16, is made to vary in inverse proportion to the charge on the particle beam bunch 2. As a consequence, the servo system 16 is effective to remove the electric charge dependence from the output signals $V_x$ and $V_y$, which are thus left proportional to only the transverse positions of the particle beam bunch 2 within the vacuum chamber 1. It will be understood that one advantage of the invention is the increased accuracy it provides, because the circuit elements following the gain-adjustable amplifier are required to operate over a smaller dynamic range of signal inputs, therefore, they can be made to operate over only the most linear part of the operating range of those elements.

Referring, again, to the timing circuit or clock 20 that is operably connected to both of the high-speed switches 5 and 12, it should be noted that in the preferred embodiment this timing circuit 20 comprises a simple conventional digital timing system that consists of a digital clock and other digital electronics that are suitably operably connected to make the switches 5 and 12 move in the desired synchronism. A simple conventional digital logic circuit 21, of suitable commercially available design, is arranged to make the second switch 12 dwell on each of its contacts for a slightly shorter period of time than the dwell times for the respective contacts on the first switch 5. This mode of operation is used in order eliminate various transient effects of the electronics.

Figure 2:
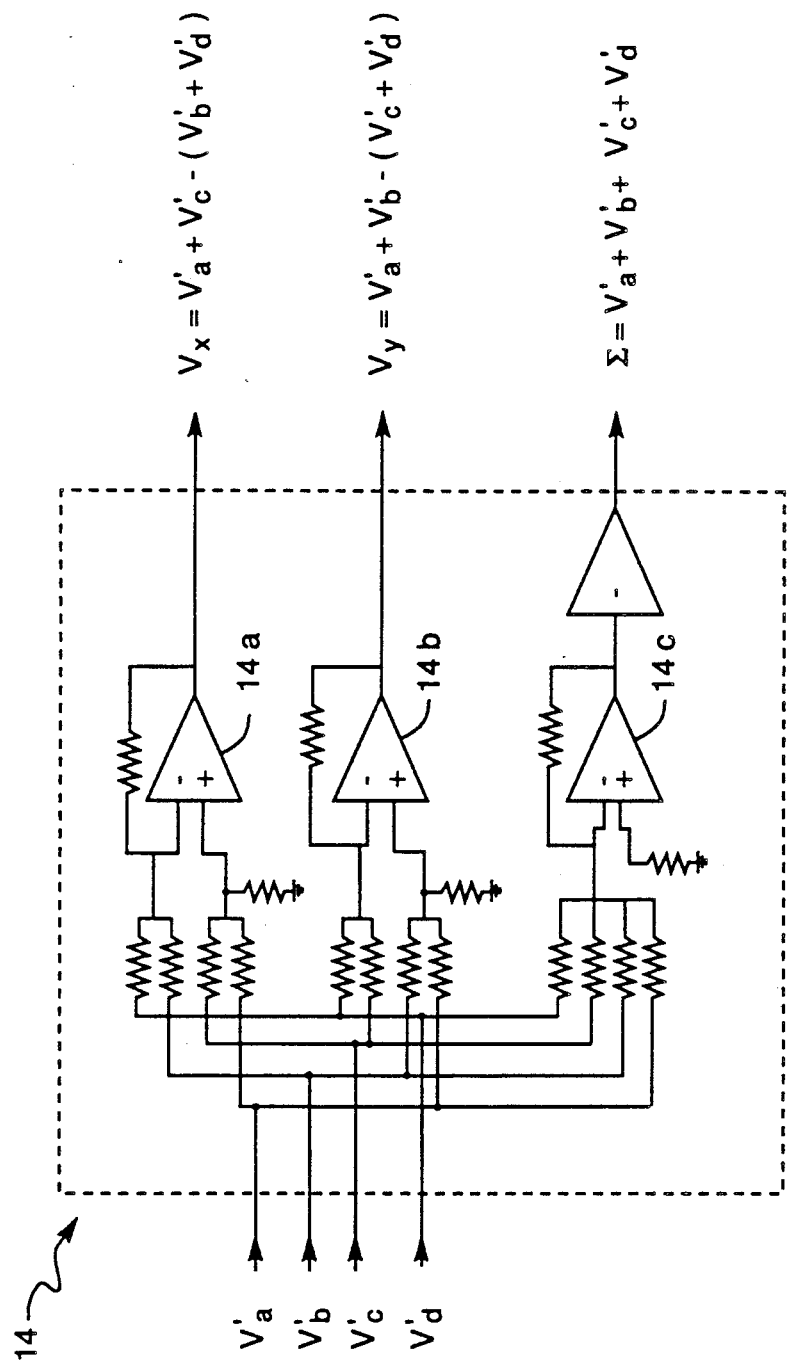
FIG. 2 is a simplified schematic circuit diagram of a portion of the output circuitry of the circuit shown in FIG. 1, illustrating in detail the use of a plurality of conventional operational amplifiers to produce first and second output signals that are each proportional to the transverse position of a monitored charged particle beam, and to produce a third signal which is proportional to the sum of voltages detected by a plurality of pick-up electrodes used for monitoring the position of the charged particle beam.

Referring to FIG. 2 it will be seen that there is shown in simplified form details of the components used in the preferred embodiment of the summing logic means 14, which was generally described above. The output signals from the logic 14 are shown respectively as the output voltages $V_x$, $V_y$ and $\Sigma$. The respective input signals $V'_a$ $V'_b$ $V'_c$ and $V'_d$, are connected to four buses, as illustrated in FIG. 2. Each of those four buses are connected through series resistors, as shown in FIG. 2, to three commercially available operational amplifiers 14a, 14b and 14c, with associated feedback circuits connected as shown.

From the foregoing description of the invention, it will be apparent to those skilled in the art that various alternative embodiments and modifications of the invention may be made without departing its true and intended scope. Accordingly, it is our intention to encompass within the following claims the true limits of the invention.

We claim:

1. An electric circuit for comparing the relative amplitude of a predetermined number of electric input signals, comprising,
   a first high speed electronic switch and a single-channel amplifier-detector means, said first switch, being operably connected and effective to sequentially connect each of said input signals to an input of the single channel amplifier-detector means, said amplifier-detector means having a variable-gain amplifier,
   a second high speed electronic switch operably connected and effective to receive signals in sequence from the output of said amplifier-detector means and to feed each of the received signals, respectively, to one of the output contacts of said second switch,
   a plurality of integrating sample and hold circuit means each of which are operably connected, respectively, to one of the output contacts of said second switch,
   a plurality of operational amplifiers, said integrating sample and hold circuit means each being operably connected, respectively, to one of said operational amplifiers and being effective to generate first, second and third output voltages that are, respectively, proportional to a first summed ratio of said input signals, a second summed ratio of said input signals, and the sum of all of the output voltages from the respective integrating sample and hold circuit means,
   a plurality low pass filters operably connected to the respective outputs of said operational amplifiers, said filters being effective to optimize said output signals and,
   a servo system means including a source of reference voltage, said servo system means being operable to compare said third output voltage with the reference voltage in the servo system means to develop a varying control voltage that is fed back to the variable-gain amplifier in said amplifier-detector means, thereby to maintain said third output voltage constant when the sum of the amplitudes of the voltages of said electrical input signals varies, whereby said first and second output voltages are made independent of amplitude variations in the input signals and thus are dependent, respectively, only on the first summed ratio and the second summed ratio of said input signals.

2. An invention as defined in claim 1 including a timing circuit operably connected between the first and second high speed switches to maintain the sequential movement of said switches between their respective contacts in synchronism.

3. An invention as defined in claim 2 including a logic circuit means operably connected in series relationship with the Timing Circuit, between the first and second speed switches, said logic circuit means being effective to make the dwell time of the contacts of said second switch shorter than the dwell time of the contacts of the first switch.

4. An electrical circuit for measuring and comparing a plurality of inputs signals comprising,
   a first high speed electronic switch having a plurality of input contacts each of which are operably connected to receive one of said input signals,
   a single channel variable-gain amplifier-detector circuit the input of which is connected to a common output terminal of said first high speed switch,
   a second high speed electronic switch, the output of said amplifier-detector circuit being connected to a common input terminal of said second high speed electronic switch,
   timing circuit means operably connected between said first and second high speed switches and effective to operate said switches in synchronism,
   a plurality of integrating sample and hold circuits each of which has its input connected to one of the respective output contacts of said second high speed switch,
   a plurality of operational amplifiers and low pass filters operably connected to receive, respectively signals output from the integrating sample and hold circuits and effective to provide a first output signal ($V_x$) proportional to a predetermined summed ratio of the input signals, a second output signal ($V_y$) proportional to a second summed ratio to the input signals, and a third output signal equal to the sum of the respective output voltages of said operational amplifiers and,
   a servo system including a source of reference voltage, said servo system being operable to compare said third output signal with the reference voltage and to generate a slowing varying control signal that is fed back to vary the gain of the amplifier in said amplifier-detector circuit, thereby to make said first and second signals independent of variations in the sum of the amplitudes of said input signals.

5. In combination with a particle beam accelerator having a plurality of particle beam position-indicating pick-up electrodes disposed at predetermined locations within the accelerator,
   a first multi-contact high speed electronic switch operably connected to receive on each of its input contacts respectively a input signal generated on one of said pick-up electrodes,
   a variable-gain amplifier-detector having its input connected to a common output terminal of said first electronic switch,
   a second multi-contact high speed electronic switch having its common input terminal connected to the output of said amplifier-detector,
   a plurality of integrating sample and hold circuit means each of which are operably connected, respectively, to one of the output terminals of said second switch, a summing logic means operably connected to the output of said integrating sample and hold circuits and being effective to generate a first output voltage that is proportional to the horizontal transverse location of a particle beam within said accelerator, a second output voltage that is proportional to the vertical transverse position of a particle beam in said accelerator and a third output signal that is proportional to the sum of the voltage signals input to said summing logic means and, a servo system operably connected between said third output voltage and the variable-gain amplifier in the amplifier-detector, said servo system having a source of reference voltage and a comparator for comparing said reference voltage to said third output voltage, and being effective to develop a slowly varying feedback control signal to the variable-gain amplifier in the amplifier-detector circuit, said control signal being effective to make said first and second output signals independent of common amplitude variations in the input signals induced on said pick-up electrodes, whereby an accurate, real time measurement of changes in both the horizontal and vertical transverse movement of said particle beam and in the vertical transverse movement of the said particle beam is provided by said first and second output voltages.

6. An invention as defined in claim 5 wherein said servo system includes means for selectively varying and setting the reference voltage.

7. An invention as defined in claim 6 including a timing circuit that is operably connected between said first and second high speed switches and is effective to cause the second switch to dwell on its respective contacts for a slightly shorter interval of time then the dwell period for the contacts of said first electronic switch.

* * * * *